(12) United States Patent
Ware et al.

(10) Patent No.: US 9,111,587 B2
(45) Date of Patent: Aug. 18, 2015

(54) STACKED MEMORY WITH REDUNDANCY

(71) Applicant: Rambus Inc., Sunnyvale, CA (US)

(72) Inventors: Frederick A. Ware, Los Altos Hills, CA (US); Paul D. Franzon, New Hill, NC (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/319,544

(22) Filed: Jun. 30, 2014

(65) Prior Publication Data

US 2014/0321186 A1  Oct. 30, 2014

Related U.S. Application Data

(63) Continuation of application No. 13/728,330, filed on Dec. 27, 2012, now Pat. No. 8,804,394.

(60) Provisional application No. 61/585,437, filed on Jan. 11, 2012.

(51) Int. Cl.
  *G11C 7/00* (2006.01)
  *G11C 5/02* (2006.01)
  *G11C 29/00* (2006.01)
  *H01L 23/538* (2006.01)

(52) U.S. Cl.
  CPC .............. *G11C 5/02* (2013.01); *G11C 29/808* (2013.01); *H01L 23/5384* (2013.01); *G11C 2213/71* (2013.01); *H01L 2924/0002* (2013.01)

(58) Field of Classification Search
  CPC ........ G11C 5/02; G11C 5/04; G11C 2213/71; G11C 5/06; G11C 29/808; G11C 29/846
  USPC ............ 365/200, 189.07, 201, 51, 63, 185.09
  See application file for complete search history.

(56) References Cited

U.S. PATENT DOCUMENTS

| 7,599,205 B2 | 10/2009 | Rajan |
| 7,835,207 B2 | 11/2010 | Keeth et al. |
| 7,916,564 B2 * | 3/2011 | Park .............................. 365/200 |
| 2010/0192041 A1 | 7/2010 | Jeddeloh |

* cited by examiner

*Primary Examiner* — David Lam
(74) *Attorney, Agent, or Firm* — Lance Kreisman; Peninsula Patent Group

(57) ABSTRACT

A stacked memory is disclosed including a first integrated circuit memory chip having first storage locations and a second integrated circuit memory chip disposed in a stacked relationship with the first integrated circuit memory chip. The second integrated circuit memory chip has second storage locations. Redundant storage is provided including a first storage area dedicated to storing failure address information of failure address locations in the first or second integrated circuit memory chips. The redundant storage includes a second storage area dedicated to storing data corresponding to the failure address locations. Matching logic matches incoming data transfer addresses to the stored failure address information.

20 Claims, 11 Drawing Sheets

STACKED MEMORY WITH REDUNDANCY

CROSS-REFERENCE TO RELATED APPLICATIONS

This application is a continuation of U.S. patent application Ser. No. 13/728,330, filed Dec. 27, 2012, now U.S. Pat. No. 8,804,394 titled STACKED MEMORY WITH REDUNDANCY, which claims the benefit of priority under 35 U.S.C. §119(e) to Provisional Application Ser. No. 61/585,437, filed Jan. 11, 2012, titled STACKED MEMORY WITH REDUNDANCY, which is incorporated herein by reference in its entirety.

BACKGROUND

Many computer systems use dynamic random access memory (DRAM) as system memory to temporarily store an operating system, critical applications, and data. With widespread use of multi-core processors, particularly, in servers and workstations, higher capacity and faster memory devices are needed to catch up with the computing power of these processors, thereby reducing the processor-memory performance gap and allowing the applications to use the full processing speed of modern processors.

One way to narrow the processor-memory performance gap is to develop innovative technologies to enhance characteristics of DRAM chips in terms of capacity and bandwidth. Yet another way is to increase storage capacity by stacking memory chips, while using existing DRAM technologies. For example, in servers and storage applications, chip stacking can be used to obtain high memory densities in a smaller space and most likely at a lower cost. Other industrial or embedded applications may demand different memory requirements, but typically high-density chip stacking is needed where space is constrained, therefore requiring more memory capacity on the same or a smaller memory module form factor.

One way to form stacked memory chips involves mounting two or more memory chips, one on top of the other, and interconnecting them using through-silicon-vias (TSVs).

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Figure 1:
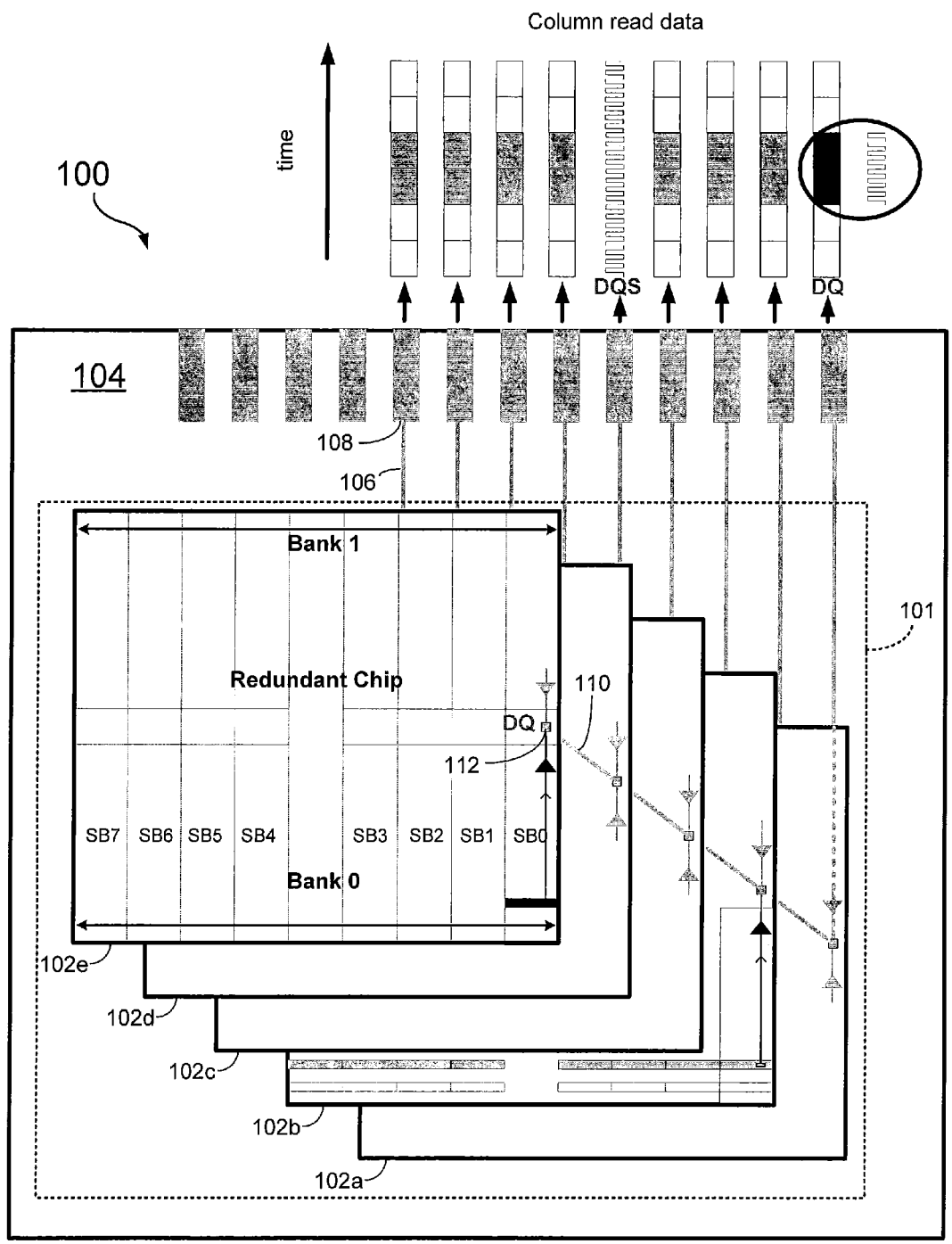
FIG. 1 illustrates stacked memory, and an associated timing diagram.

Embodiments of a stacked memory are disclosed. In one embodiment, the stacked memory includes a first integrated circuit memory chip having first storage locations and a second integrated circuit memory chip. The second integrated circuit memory chip is disposed in a stacked relationship with the first integrated circuit memory chip and includes second storage locations. A redundant memory chip is shared by the first and second integrated circuit memory chips. The redundant memory chip has redundant storage locations that selectively replace corresponding storage locations in the first or second integrated circuit memory chips. The stacked memory also includes a pin interface for coupling to an external integrated circuit memory controller and respective first and second signal paths. The first signal path is formed through the first and second integrated circuit memory chips and is coupled to the redundant memory chip. The first signal path also couples to the pin interface. The second signal path is formed through the first and second integrated circuit memory chips and is coupled to the redundant memory chip. The second signal path couples to the pin interface via the first signal path.

In a further embodiment, a method of operation in a stacked memory is disclosed. The method includes receiving a read data request from an integrated circuit memory controller; accessing read data from a plurality of stacked integrated circuit memory chips, a portion of the read data stored in a redundant memory chip; internally transferring the portion of the read data from the redundant memory chip to a selected one of the plurality of stacked integrated circuit memory chips; and externally transferring the read data from the selected one of the stacked integrated circuit memory chips to the integrated circuit memory controller.

In yet another embodiment, a memory module is disclosed. The memory module includes a substrate having a databus for coupling to an integrated circuit memory controller. A plurality of stacked memories are disposed on the substrate. Each of the stacked memory includes a first integrated circuit memory chip having first storage locations and a second integrated circuit memory chip. The second integrated circuit memory chip is disposed in a stacked relationship with the first integrated circuit memory chip and has second storage locations. A redundant memory chip is shared by the first and second integrated circuit memory chips. The redundant memory chip has redundant storage locations that selectively replace corresponding storage locations in the first or second integrated circuit memory chips. An external connection interface couples to the databus. A first signal path is formed through the first and second integrated circuit memory chips and is coupled to the redundant memory device. The first signal path couples to the external connection interface. A second signal path is formed through the first and second integrated circuit memory chips and is coupled to the redundant memory chip. The second signal path is coupled to the external connection interface via the first signal path.

Referring now to FIG. 1, a stacked memory is shown, generally designated 100, that employs a stack 101 of integrated circuit memory chips 102a-102e. All but one of the memory chips take the form of primary memory chips (102a-102d) while the remaining chip (102e) is realized as a redundant or spare memory chip having the same general layout or architecture as each primary memory chip. In one embodiment, the chips are stacked as bare semiconductor die and interconnected by vertically formed through-silicon-vias (TSVs), as more fully described below. The stack may be mounted on a device substrate 104 and encapsulated for subsequent assembly onto, for example, a memory module substrate (not shown). The device substrate includes routing paths 106 and associated contacts 108 that electrically couple various I/O circuits DQ within the stack 101 to a memory module data bus (not shown).

Further referring to FIG. 1, in one specific embodiment each memory chip in the stack is organized into separate banks Bank0 and Bank1 disposed on opposite sides of each chip. The I/O circuits DQ are shared by the banks and are interposed therebetween. The I/O circuits, or interface circuitry, generally may be thought of as organized into a plurality of interface circuit "slices" DQ0-DQ7 that access respective portions or sub-banks SB0-SB7 of memory core circuitry in each of the respective banks. Each interface circuit slice for a given chip is electrically connected to a corresponding interface slice in a different chip to form respective DQ data buses 110 vertically routed through the stacked chips, and electrically coupled to an I/O data pin or pad 112 on each chip.

As noted above, the memory chip stack 101 includes at least one redundant or spare memory chip 102e. Employing a redundant memory chip in the chip stack 101 allows for significant assembly-level yield improvements. Failures that may develop after assembly of the stack might otherwise result in the scrapping of the assembly if not for the redundancy of the spare chip. As a failed location in a primary chip core is identified (during, for example, an initialization routine or post-assembly test), a corresponding storage location in the redundant chip may be activated as a substitute storage location. Mappings generated during the initialization steer the data from the addressed defective primary chip storage location to the redundant chip storage location during system operation.

One problem that arises with the architecture described above involves maintaining the synchronization of read data with the overall memory system timing. Source-synchronous architectures generally employ a timing signal to accompany transmitted data to maintain the timing between the data source and destination. The timing signal and the data signal theoretically experience the same propagation delays. Typical read operations carried out with the primary memory chip involve accessing multiple I/O circuits, or DQs, on the same chip in parallel, and transmitting the accessed data back to a memory controller (not shown). The timing signal typically used is a read strobe or clock and is generally transmitted by the chip from where the read access occurs. At the receive end of the signaling path, the timing signal is then used to clock the data into a receiver sampler. However, in the event that a portion of the data is retrieved from the redundant device, no separate timing signal is available to maintain system synchronization. The timing illustration of FIG. 1 positioned above the chip stack I/O pins shows eight columns of read data, seven of the columns having been transmitted from memory chip 102b (with a light shade representing data bits from the primary chip), and one column of data (dark shade representing bits from the redundant chip) having been transmitted from the redundant chip 102e. While the read strobe signal DQS accompanies the data from primary memory chip 102b in a source-synchronous relationship, no such timing signal path is available to accompany the data transmitted from the redundant memory chip 102e. In other words, the only timing signal available (on a per-byte basis) to accompany the eight columns of data from the chip stack to the controller, in this example, originates with the primary chip 102b.

Figure 2:
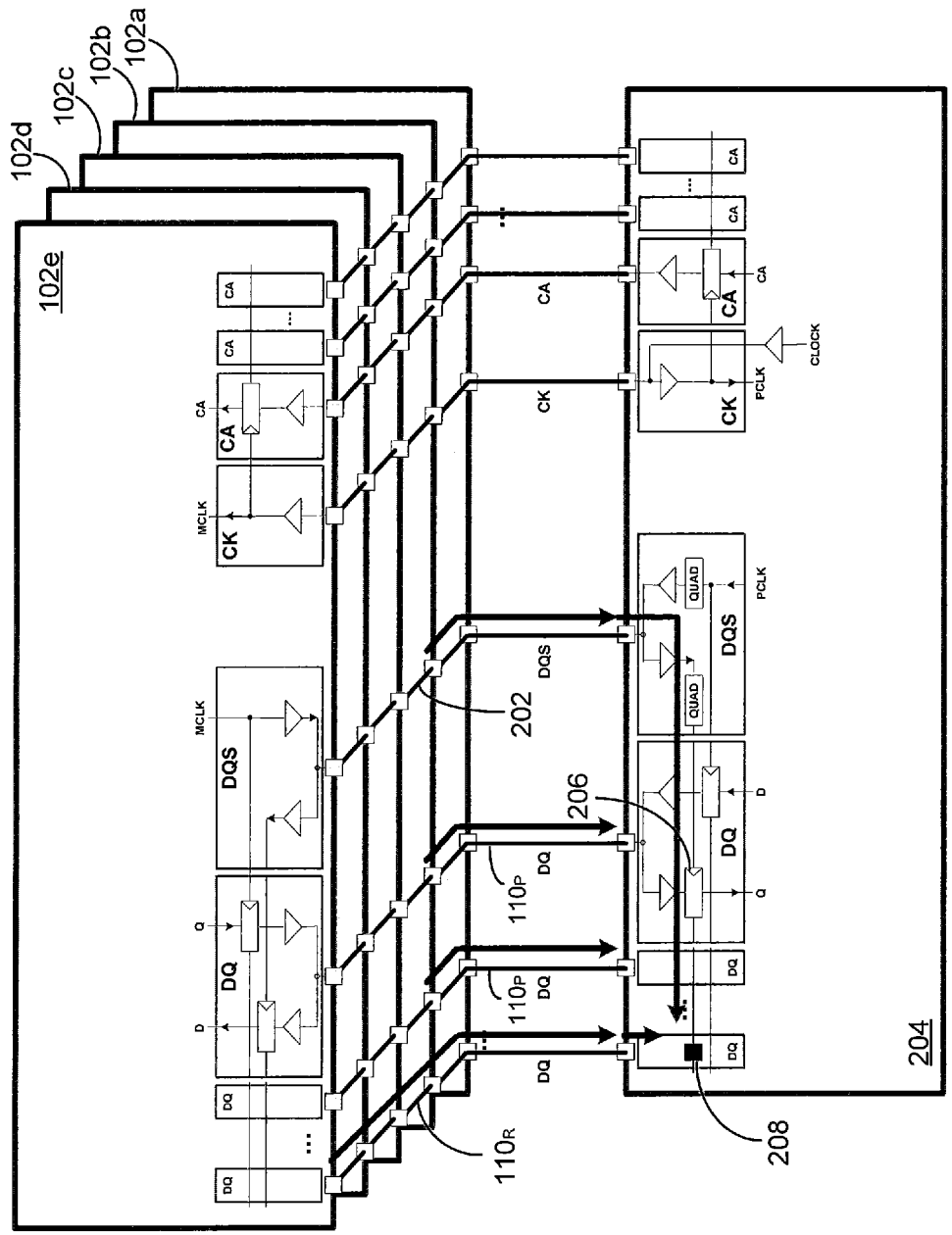
FIG. 2 illustrates further detail of the stacked memory of FIG. 1.

FIG. 2 illustrates further detail regarding the synchronization problem noted above relating to the stacked chip architecture of FIG. 1. Respective data DQ and strobe DQS busses 110 and 202 are generally routed vertically through the chips and direct data and timing signals from the stack to a logic device 204, such as a memory controller. For purposes of clarity, adjacent the data DQ and strobe DQS busses 110 and 202 are flow lines indicating the origination and transfer flow of read data and associated timing signals. As can be seen from the figure, for the specific example where data is being accessed and transferred in a read operation from the second memory chip 102b, the far left DQ data path 110R routes data from the top chip (the redundant chip 102e in our previously discussed example), while the rest of the DQ paths 110P route data accessed from the second primary memory chip 102b.

The read data accessed in the second primary memory chip 102b and transmitted to the memory controller 204 is accompanied by the timing signal DQS. The timing signal DQS is involved in accurately clocking the read data into appropriate receiver samplers, such as at 206. Unfortunately, the same cannot be said for the read data accessed from the redundant chip 102e, which follows a different and longer propagation path. Thus, signals propagating from the redundant memory chip incur an additional time-of-flight delay not experienced by the timing signal DQS that originated on the second memory chip 102b. Attempting to sample the delayed redundant data, such as by receiver 208, with the timing signal DQS that originated at primary chip 102b would result in bad data.

Figure 3:
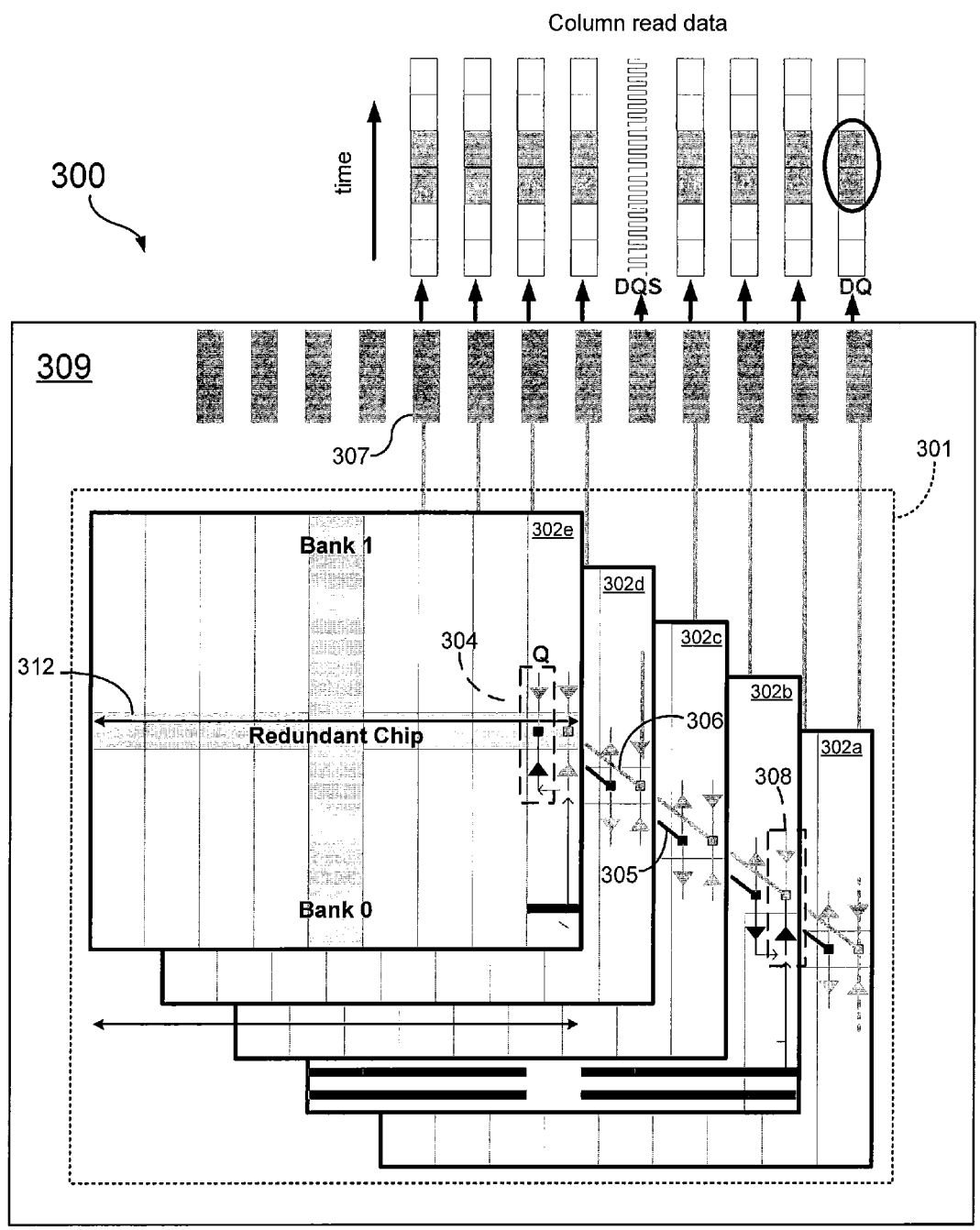
FIG. 3 illustrates a block diagram of one embodiment of a stacked memory and an associated timing diagram.
Figure 5:
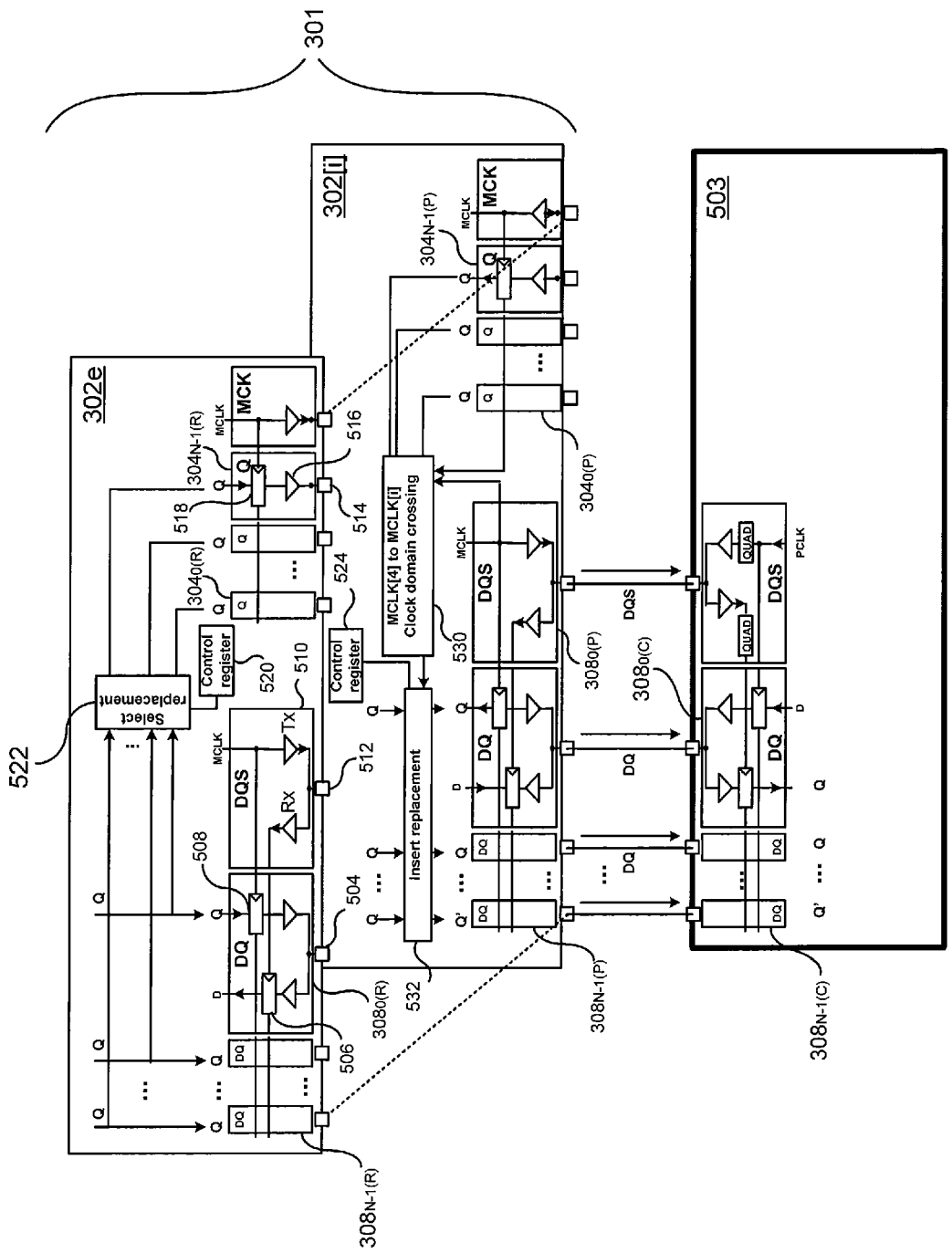
FIG. 5 illustrates the device I/O architecture of the stacked memory of FIG. 3 in accordance with one embodiment.

With reference to FIG. 3, a stacked memory 300 in a further embodiment includes a stack 301 of memory chips 302a-302e in the form of integrated circuit DRAM memory chips. Similar to the previously described embodiment, at least one of the chips in the stack operates as a redundant memory chip (302e) while the remaining chips operate as primary memory chips (302a-302d). All of the primary chips are identical in construction and assembled as bare chips into a vertical orientation or "stack." Through-silicon-vias (TSV's) formed through the chips provide inter-chip connections as more fully explained below. The redundant memory chip is formed similar to the primary memory chip, with a few circuitry differences as more fully explained below with respect to FIG. 5. The stack is generally adapted for mounting on a substrate 309, such as that associated with a memory module or graphics board, and includes contacts 307 to communicate data and control signals between the memory chip stack 301 and a memory controller. One example of a memory controller 503 is shown in FIG. 5, and is more fully discussed below.

Further referring to FIG. 3, in an effort to avoid the timing problem identified with the previously described embodiment, the stacked memory 300 employs internal interface circuits 304 that have secondary signaling paths 305 to interconnect the chips internally within the stack 301. The secondary paths, or busses, complement primary data DQ busses 306 that are associated with external interface circuits 308. The internal interface circuits provide for internal data transmissions between the chips 302a-302e that are transparent to the memory controller 503 (FIG. 5). The external interface circuits are formed similar to the interface "slices" of FIG. 1, and provide for data transmissions to and from locations external to the chip stack 301. This allows read data that originates from different chips to be aggregated in the same timing domain before being transmitted to the controller. Thus, synchronization may be preserved between the read data and the timing signal DQS for all of the interface slices, including substitute data from the spare chip 302e.

In a specific embodiment, the memory chips 302a-302e each include multiple banks, such as Bank0 and Bank1 disposed on opposite sides of an interface circuit "stripe" 312. The stripe includes the circuitry relating to the internal and external interface circuits. Detailed features at the register level relating to the interface circuitry are provided below with respect to FIGS. 5-7. Generally speaking, the interface circuitry includes internal interface resources (such as the drivers and pads for coupling to the secondary busses) to transfer data internally between the chips, and external interface resources (such as the drivers, receivers, and pads to couple to the primary data busses) to transfer data between the primary chips 302a-302d and the memory controller 503 (FIG. 5). The interface resources generally include pin circuitry with corresponding transmit drivers and receivers, and control circuitry (not shown) such as row and column decoders, sense amplifiers, etc., to establish access paths between the pin circuitry and memory core storage locations.

Figure 4:
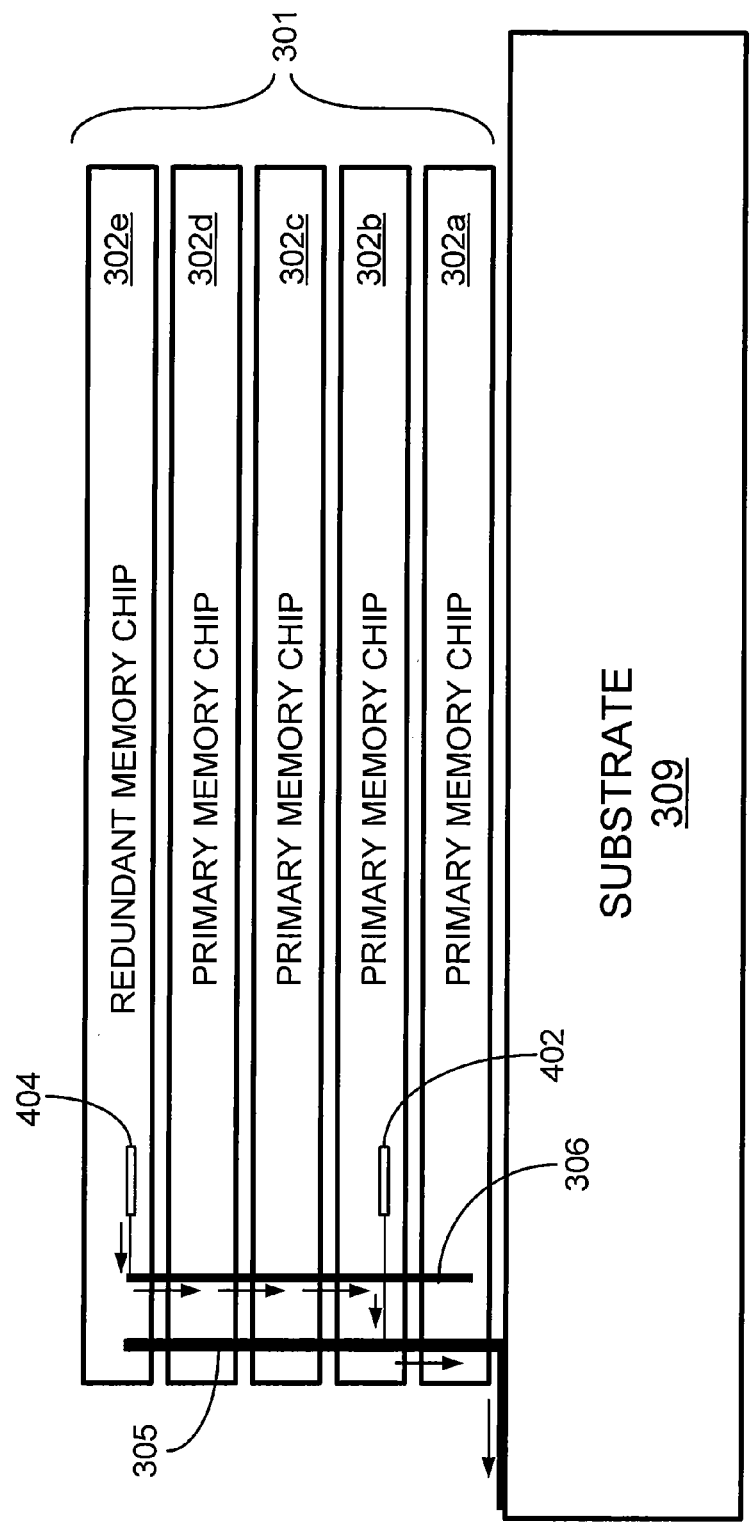
FIG. 4 illustrates a high-level block diagram transverse view of the stacked memory of FIG. 3.

FIG. 4 illustrates a cross-sectional view of the chip stack 301 with arrows showing read data flow for one example at a very high level. The four primary chips 302a-302d, are shown under the one redundant chip 302e and together are mounted on the package substrate 309. Shown as vertical paths at 306 and 305 are the respective primary and secondary data busses routed between the chips through formation of TSV's. A defective storage location 402 in the core of the second primary chip 302b is substituted by a corresponding location 404 in the redundant memory chip 302e. In response to a data read command, data from the redundant location 404 is accessed (rather than from the faulty primary location), and then transferred along the Q-bus 306 to the second primary memory chip 302b. At the second primary memory chip 302b, the redundant data is aggregated with other data originating from the second chip, as more fully explained below. The aggregated data is then transferred to the data DQ bus 305 where it is accompanied by a source-synchronous timing signal DQS originating from the same second chip 302b.

FIG. 5 illustrates the memory chip stack 301 in relationship to the memory controller 503, with further detail of the internal and external interface circuits 304 and 308 consistent with FIGS. 3 and 4 above. The redundant memory chip 302e employs a set of external interface circuits $308_{0(R)}$-$308_{N-1(R)}$ that each include a pad 504 that couples to a transceiver having a receiver $R_x$ and a transmitter $T_x$ connected to the pad. Respective latches 506 and 508 have timing inputs clocked by the strobe signal DQS that originates on the redundant memory chip. The timing signal DQS has a dedicated interface circuit 510 and an associated pad 512.

Further referring to FIG. 5, in addition to the external interface circuits $308_{0(R)}$-$308_{N-1(R)}$, the redundant memory chip 302e has a set of internal interface circuits $304_{0(R)}$-$304_{N-1(R)}$ that each include a pad 514 driven by a driver 516. A latch 518 clocked by a master clock MCLK receives replacement data for transmission by the driver 516 to a selected primary memory chip 302[i]. In one embodiment, the master clock for the internal interface circuits is a half-rate clock operating at half the data rate of the strobe timing signal DQS, although other slower rates may be employed.

The redundant memory chip 302e further includes a control register 520 and replacement selection circuitry 522. The control register stores values representing bank, row and column addresses of replacement locations. The replacement locations, or failed locations, are determined during an initialization or other test sequence used to identify failed cells within the various primary memory chips. A programmed re-mapping of the failed locations to corresponding spare locations takes place based on the initialization results. The replacement selection circuitry 522 couples to the internal interface circuits $304_{0(R)}$-$304_{N-1(R)}$ for loading replacement data bits onto the internal data bus 305 during operation.

With continued reference to FIG. 5, each of the primary memory chips 302a-302d (represented as 302[i]) includes respective sets of external interface circuits $308_{0(P)}$-$308_{N-1(P)}$, internal interface circuits $304_{0(P)}$-$304_{N-1(P)}$, and a strobe generation circuit DQS that correspond to those provided by the redundant memory chip 302e. The primary chips also each include a control register 524 that stores the addresses of failed locations. Coupled to the internal interface circuitry $304_{0(P)}$-$304_{N-1(P)}$ is a clock domain crossing circuit 530 that re-times data from the internal interface data bus (which was accompanied by a half-rate clock) so that it is synchronous with the read data originating from that primary memory chip. Replacement circuitry 532 selects the proper external interface circuit DQ for inserting the redundant data.

As noted above, the internal interface circuitry $304_{0(P)}$-$304_{N-1(P)}$ couples to the clock domain crossing circuit 530 to re-time the read data from the internal interface bus 305 (which was accompanied by a half-rate clock) such that the timing of the data moves from the redundant memory chip timing domain to the primary chip timing domain. This re-timing places the redundant data in a synchronous timing relationship with the read data originating from the primary memory chip. Once the data is aggregated across the multiple interface circuits, it is transmitted as one or more read data words with an accompanying timing reference signal DQS to corresponding external interface circuits $308_{0(C)}$-$308_{N-1(C)}$ disposed on the memory controller 503.

Figure 6:
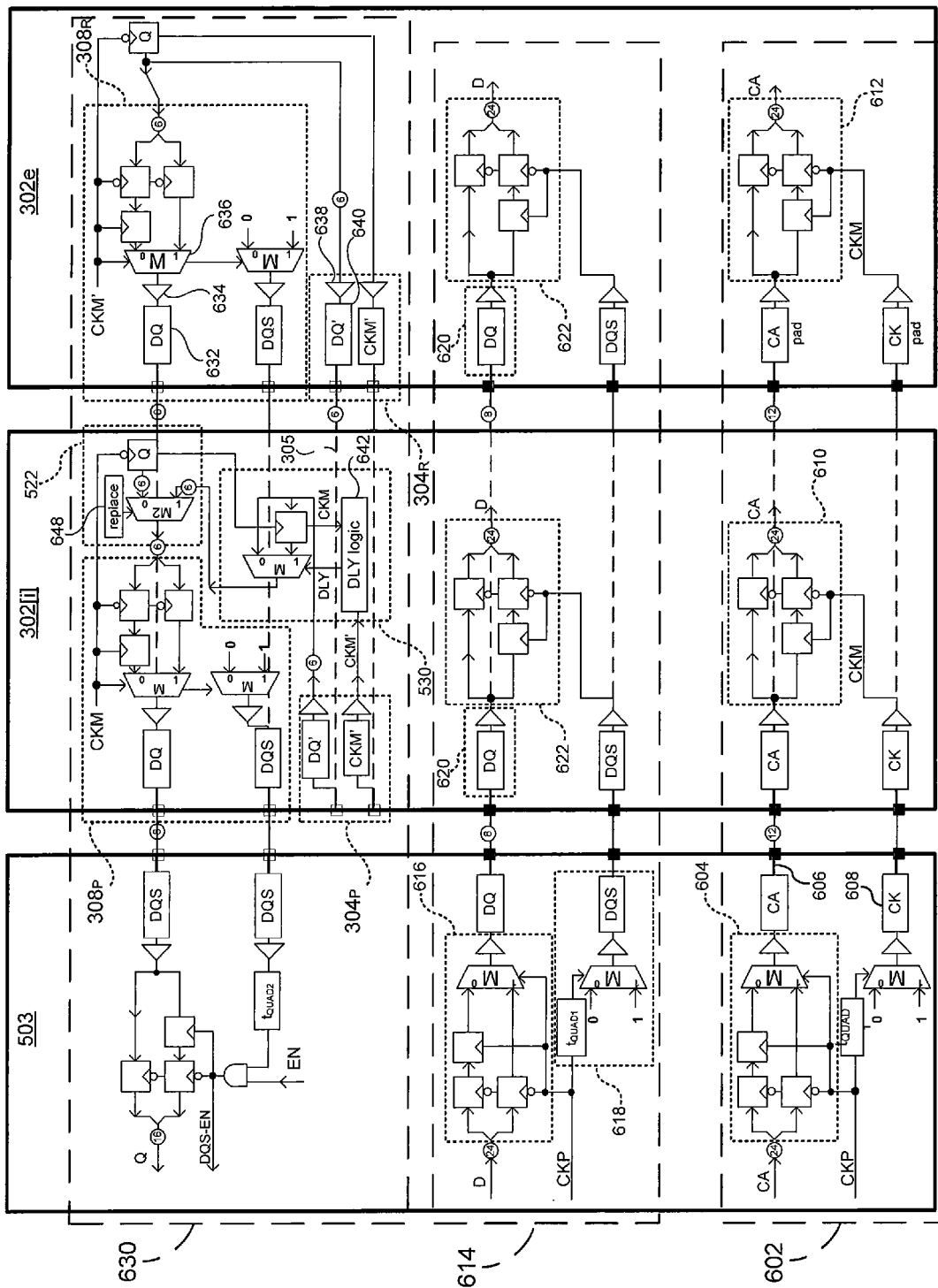
FIG. 6 illustrates additional circuit detail associated with one embodiment of the I/O architecture of FIG. 5.

FIG. 6 illustrates register-level features regarding respective read, write and control/address paths 602, 614 and 630 employed between the memory controller 503, a selected primary memory chip 302[i], and the redundant memory chip 302e. The control/address path 602 includes circuitry that supports transmission of control and address signals from the memory controller 503 to the memory chip stack (represented by chips 302[i] and 302e). In one specific embodiment, and beginning at the memory controller, 24 bits of control and address information are fed through serialization logic 604 and output onto 12 control/address (CA) pins 606 with an accompanying clock signal CK driven by clock pad 608. At the selected primary memory chip 302[i], the control/address information is received and deserialized by deserialization logic 610. The appropriate memory core access resources, such as row and column decoders (not shown), are activated on the primary memory chip to access storage locations corresponding to the address. In situations where one or more of the addresses involve failed storage locations identified in the control registers of the primary and redundant memory chips 302[i] and 302e, the redundant memory chip acts upon the information by providing access to a redundant location that corresponds to the failed primary chip location. Deserialization circuitry 612 disposed on the redundant chip 302e steers the control/address signals to the appropriate row and column decoders to access the redundant data.

Further referring to FIG. 6, the write data path 614 includes circuitry similar to the control/address path 602, with serialization and transmit circuitry 616 to rearrange and transmit write data from 24 bit lines to 8 bit lines (a byte). A strobe generator 618 transmits a strobe signal to accompany the write data to the chip stack 301. On each memory chip, I/O receiver circuits 620 and deserialization circuits 622 rearrange the write data back to the original 24-bit parallel data structure for storage in the memory core locations activated by the control/address information.

With continued reference to FIG. 6, the read data path 630 has external interface circuits 308R and 308P disposed on the redundant memory chip 302e and primary memory chip 302 [i] similar but in a reverse manner to the write data path and control/address path, to provide for the transmission of data from the memory chip(s) to the controller 503. Each external interface circuit 308 for each primary memory chip and redundant chip includes an I/O pad 632 and associated driver 634 fed by a multiplexer 636. For external data DQ interface circuits in the primary chip 302[i], the inputs to the multiplexer include data retrieved from the primary chip core. In one embodiment, the external interface circuits in the redundant chip 302e are accessible by the memory controller 503 in certain circumstances. Generally, however, data accessed from the redundant chip core is routed by data registers to the internal interface circuits Q for transmission to a selected primary chip, then to the controller.

Further referring to FIG. 6, in one embodiment the redundant chip internal interface circuits 304R employ multiple "substitute" data bit lines (similar to the external interface circuits) including respective drivers 638 coupled to I/O pads 640. A timing signal CKM' accompanies the substitute data bits. The data bits and the timing signal are transferred by the redundant chip along the internal data bus 305 (in dotted lines) and are received by the selected primary chip 302[i] having the failed storage location corresponding to the substituted data. The selected primary chip includes internal interface circuits 304P activated by the primary chip control register 524 (in response to an address matching one of the failed addresses stored in the control register).

Data transferred along the internal data bus, as noted above, is done so in one embodiment at a rate lower than the external data bus, such as at a single data rate (SDR). To synchronize the substitute data with the timing domain of the selected primary chip 302[i], the substitute data bits are fed to the clock domain crossing circuitry 530. Generally, the clock domain crossing circuitry determines whether a delay is to be applied to the substitute data in order to appropriately synchronize it to the primary chip timing domain. The circuitry includes delay logic 642 that has inputs to receive the substitute data clock CKM' and a primary chip clock CKM. The clocks are compared, with the result of the comparison used as a control input to a first multiplexer M1. The multiplexer includes a first input that directly receives the substitute data from internal interface circuit, and a second input that receives a delayed version of the substitute data via delay element 646. The output from the first multiplexer M1 is then fed as an input to a second multiplexer M2, which forms the basis for the replacement circuit 522. The second multiplexer M2 then selects between the substitute data stream (delayed or not, depending on the delay logic 642 and multiplexer M1) or the primary data stream based on a control value generated by a replacement circuit register 648. The selected data is then fed from the output of the second multiplexer M2 to multiple external interface serializers 650 for transmission from the primary chip 302[i] to the memory controller 503.

Figure 7:
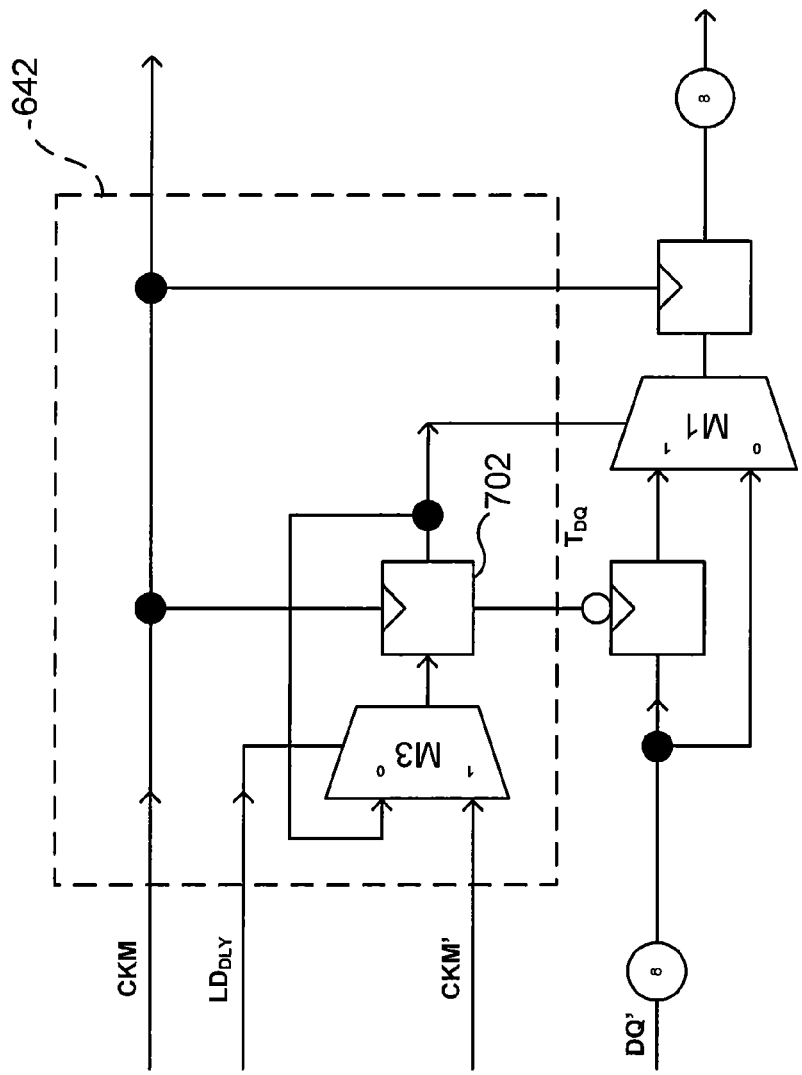
FIG. 7 illustrates one embodiment of the delay logic of FIG. 6.

FIG. 7 illustrates further detail regarding one specific embodiment of the delay logic 642 of FIG. 6. The logic includes a multiplexer M3 responsive to a load delay control input LDDLY to select between the internal interface clock CKM' and the output from a delay element 702. The multiplexer output represents a control signal that is fed to the first multiplexer M1 (FIG. 6) to selectively delay the substitute data prior to it being presented as a selectable input to the second multiplexer M2 (FIG. 6).

Figure 8:
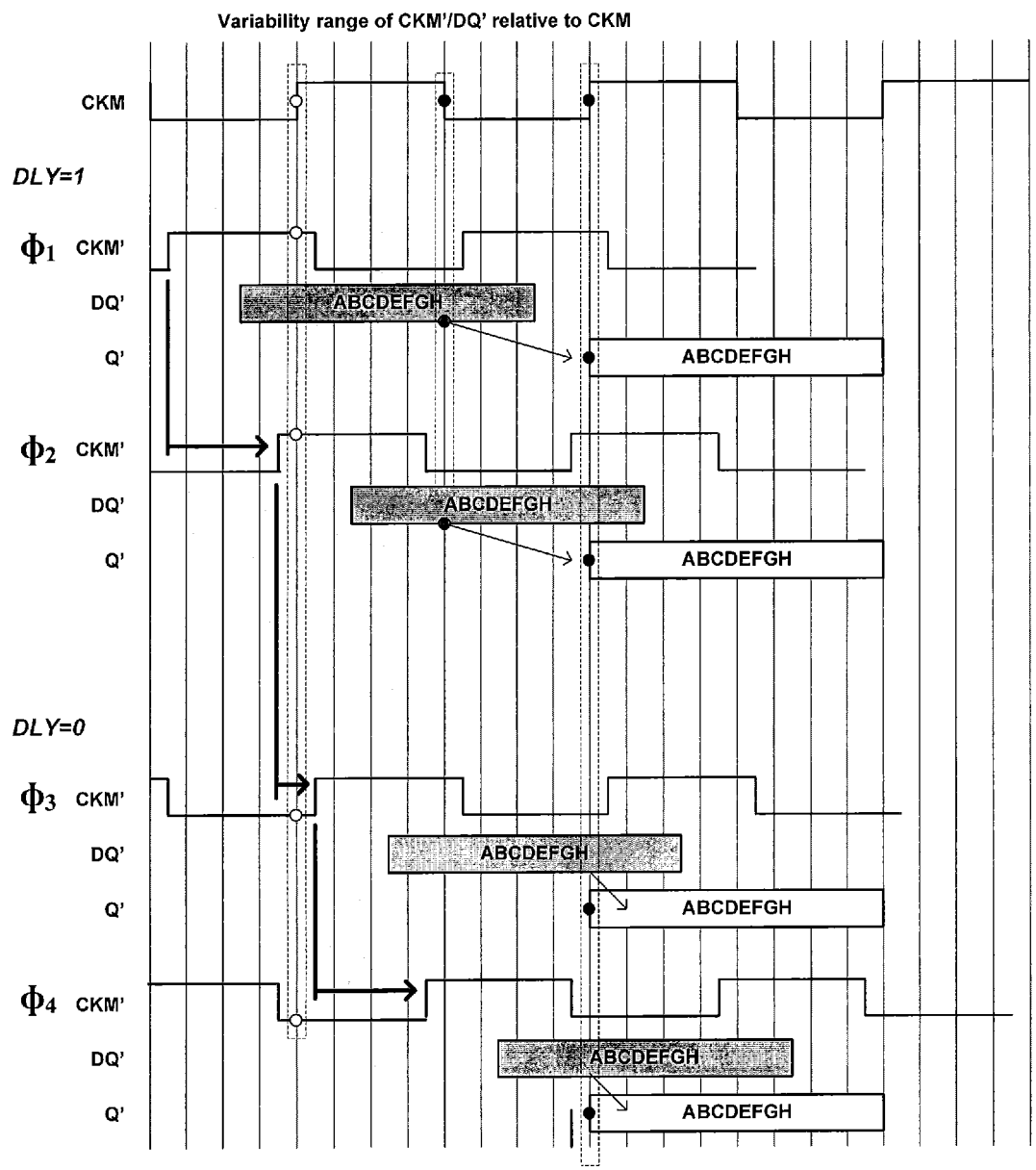
FIG. 8 represents a timing diagram showing the relative timing of data transfers involving the delay logic of FIG. 7.

FIG. 8 illustrates a timing diagram showing the variability in delay values available for the clock domain crossing circuitry 530 in allowing the substitute data to "skip" from the redundant chip timing domain (represented by shaded data) to the primary chip timing domain (represented by the non-shaded data, which is aligned with the primary chip clock CKM). The chart presents the primary chip master clock CKM as a constant periodic signal, while the redundant chip timing signal CKM' is shown in four different phase positions—two of the phases $\phi_1$, $\phi_2$ during a scenario where the delay logic control signal is at a logic "1" (resulting in an extra half-cycle of delay), and two phase positions $\phi_3$, $\phi_4$ where the control signal is at a logic low, or "0" (no extra half-cycle of delay). The domain crossing circuitry enables the application of delay values anywhere within the shaded interval range of the substitute data to accommodate for the differences in the respective timing domains.

Figure 9:
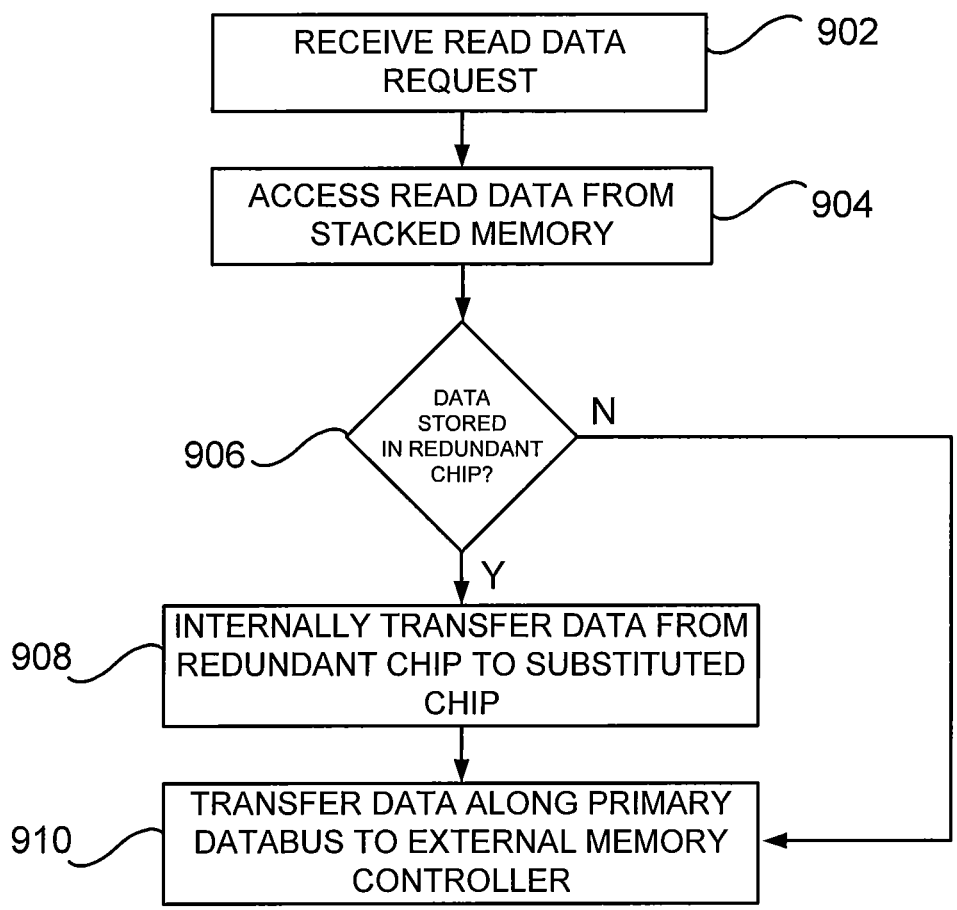
FIG. 9 illustrates a flowchart of one embodiment of a method of transferring data within a stacked memory.

FIG. 9 illustrates a high-level flowchart for read data operations involving the stacked memory 300 described above. At 902, one or more read data requests are received at the memory from the memory controller. Depending on the addresses associated with the read requests, one or more primary chips are selected to access the desired read data, at 904. A determination is made, at 906, whether any of the storage locations in the addressed range of locations was remapped to the redundant memory chip. If not, then the selected primary memory chips are accessed at 910, and the read data transferred via the external interface circuits to the memory controller, and accompanied by a suitable source-synchronous timing signal. If any of the locations in the addressed range are re-mapped to the redundant chip, then at 908, substitute data is accessed in the redundant memory chip and transferred internally to the selected primary memory chip along an internal data bus. At the primary chip, the read data is then aggregated, and the substitute data re-timed, such that all of the read data may be transferred along a primary databus to the memory controller. In this way, read data synchronization may be maintained between data accessed in the primary chips, and read data accessed in the redundant chip.

Although the structure and operation of the stacked memory 300 focuses on transferring substitute data from the redundant chip internally along the internal data bus to one or more selected primary chips, the reverse transfer flow may also be employed. In such circumstances, data accessed from one or more selected primary chips would be transferred internally from the primary chip(s) to the redundant chip, then aggregated with the substitute data and re-timed appropriately, and transferred from the redundant chip to the memory controller along the primary data bus.

In addition to providing a solution to the read data timing problem described above, use of the internal interface data bus may address other problems associated with stacked-chip memory architectures. For example, reading data from a redundant chip and a primary chip may result in different read data turnaround times. This may have the undesirable effect of lowering data transfer efficiency due to gaps between read data bursts. By first internally transferring substitute data to the primary chip, aggregating the data, then transferring the aggregated data to the memory controller, the read data turnaround time problem may be substantially mitigated.

Figure 10:
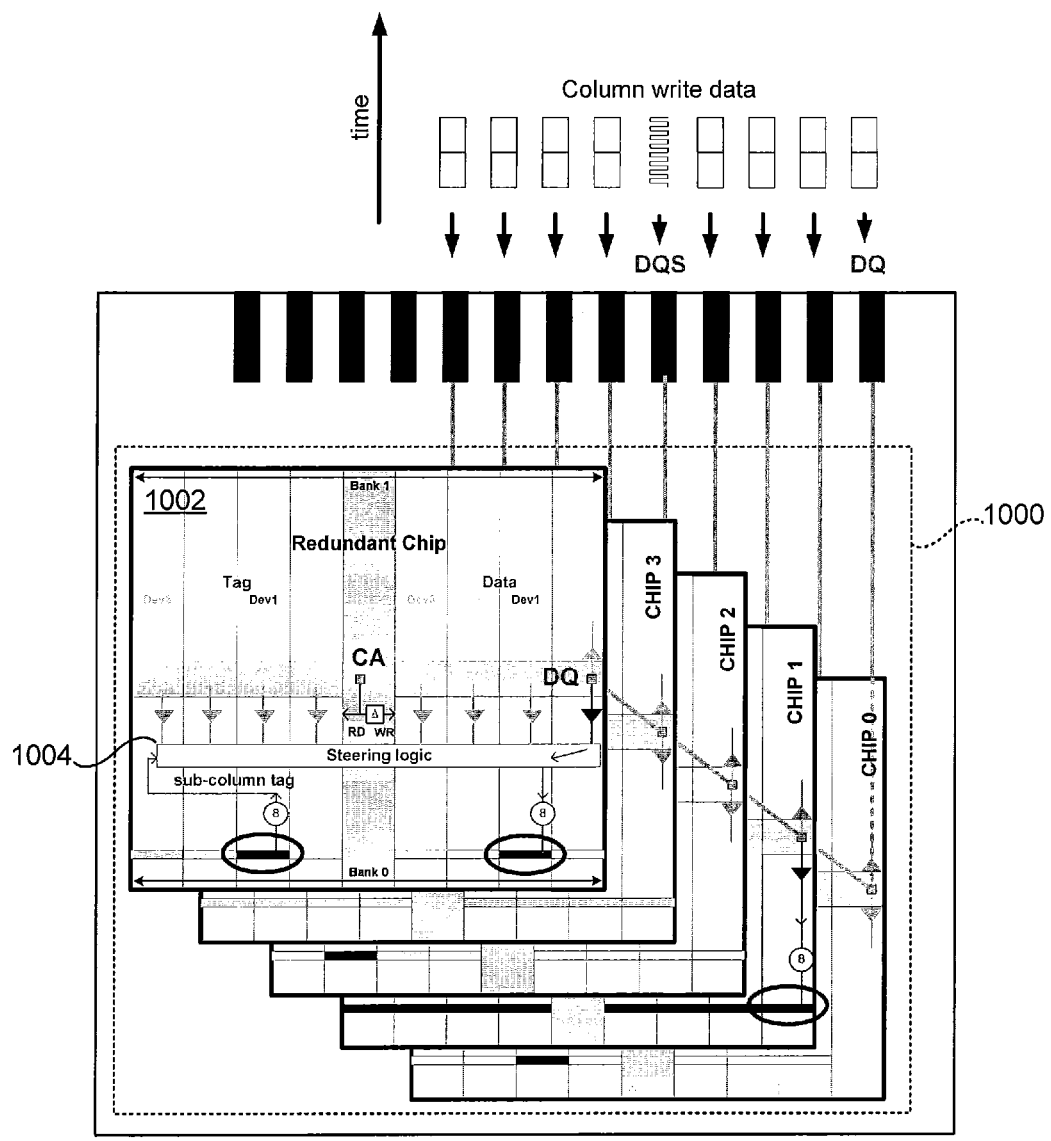
FIG. 10 represents a block diagram of an alternative embodiment to the stacked memory of FIG. 3.

FIG. 10 illustrates an embodiment of a stacked memory 1000 that provides enhanced granularity in storing and accessing redundant data to and from the redundant chip. The device generally exhibits many of the features described above relating to the structures of FIGS. 3-9, with modifications to the redundant chip to provide a more flexible vehicle for placing bad data bits in selected locations of the chip. With this in mind, the memory employs a redundant chip 1002 that employs multiple banks Bank0 and Bank1, with each bank configured to utilize half its memory capacity to store address tag information, and the other half to store data corresponding to the address tag information. Steering logic 1004 coordinates the access and transfers of data to and from the banks.

In one specific embodiment, the address tag storage area is configured as a one-set or direct cache that stores information such as: the chip number, the bank number, the row and column numbers, and so forth. The tag information is loaded from a private non-volatile memory during a system initialization operation. The data replacement size may also be specified in the tag information. As addresses are received in memory access requests, a straightforward matching operation is carried out by the steering logic to determine the location of replacement data in the data portion of the core, as specified by the matched address tag information. This functionality enables for very fine replacement granularity on the order of 8-bit tag and data sub-column blocks.

An alternate way to achieve fine granularity redundancy is to utilize the redundant chip to perform error correction code (ECC) generation and checking. This involves transferring 64-bit read data bursts to the redundant chip, which uses an additional 8-bits as a syndrome to correct no more than one bad bit in the 64-bits. The bad bit, if there is one, is corrected, then sent back along the internal data bus to the primary memory chip from where the read data originated. This allows the redundant chip to avoid storing addresses of failed locations and the associated data.

It should be noted that while the stacked memories described herein employ redundant memory chips in the form of separate integrated circuit chips, the memory redundancy may be incorporated by distributing spare memory cells throughout each of the primary memory chips. In such circumstances, spare memory cells on one primary chip could be used to store substitute data for failed locations on a different primary chip.

Figure 11:
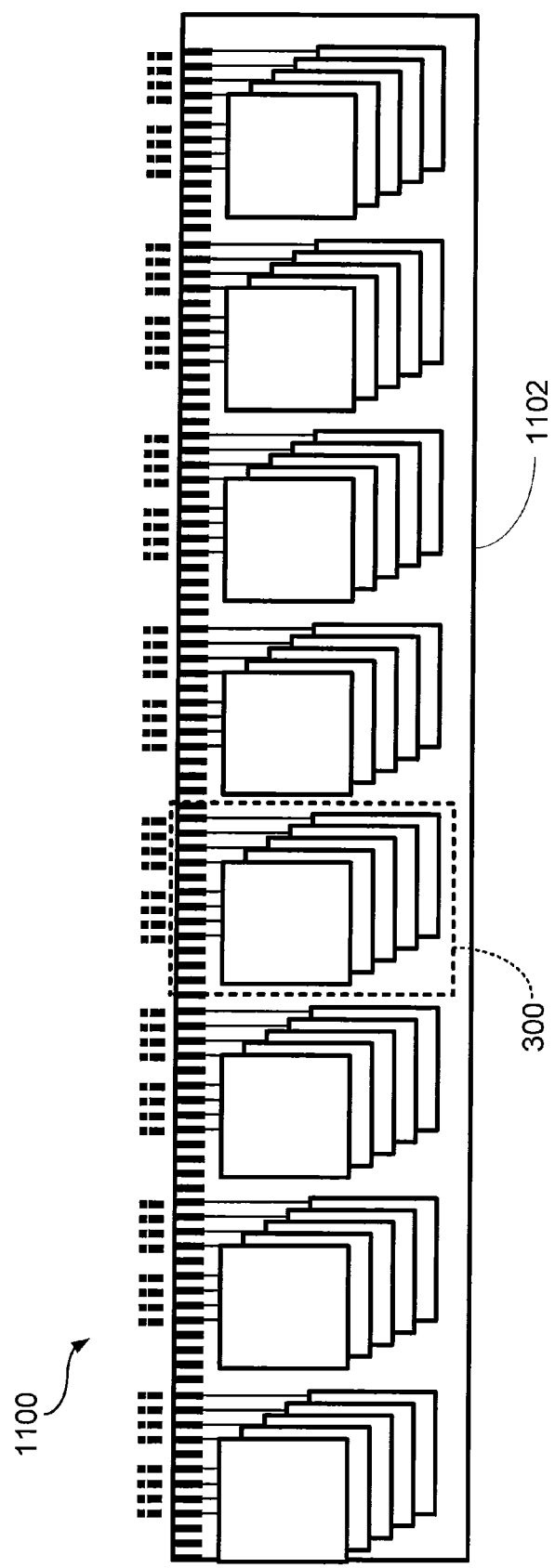
FIG. 11 illustrates a memory module that employs a plurality of stacked memories.

The stacked memories described above lend themselves well to applications that benefit from reduced footprint and high-capacity memory storage solutions. One example of such an application involves memory modules. FIG. 11 illustrates one embodiment of a memory module, generally designated 1100, that employs stacked memories 300 such as those described in detail above. The module includes a multi-layered board substrate 1102, such as FR4 in one embodiment, to mount the stacked memories and provide routing connections to a plurality of connector fingers 1104. Although FIG. 11 shows only one side of the module mounting stacked memories, the other side may also mount the stacked memories, thus realizing a doubling of memory capacity.

Those skilled in the art will appreciate the many benefits and advantages afforded by the embodiments described herein. By incorporating a redundant memory chip in the chip stack, significant assembly-level yield improvements may be realized. Further, utilizing secondary signaling paths internal to the chip stack allows for inter-chip transmissions that are transparent to a memory controller, and allow for optimal read data and strobe synchronization for read data transmissions.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, path widths, processing or operating frequencies, component circuits or devices and the like may be different from those described above in alternative embodiments. Also, the interconnection between circuit elements or circuit blocks shown or described as multi-conductor links may alternatively be single-conductor links, and single conductor links may alternatively be multi-conductor links. Links and signaling paths shown or described as being single-ended may also be differential, and vice-versa. Similarly, links described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A stacked memory comprising:
    a first integrated circuit memory chip having first storage locations;
    a second integrated circuit memory chip disposed in a stacked relationship with the first integrated circuit memory chip, the second integrated circuit memory chip having second storage locations;
    redundant storage including a first storage area dedicated to storing failure address information of failure address locations in the first or second integrated circuit memory chips, the redundant storage including a second storage area dedicated to storing data corresponding to the failure address locations; and
    matching logic to match incoming data transfer addresses to the stored failure address information.

2. The stacked memory according to claim 1, wherein the redundant storage comprises a dynamic random access memory (DRAM) chip stacked with the first and second integrated circuit memory chips.

3. The stacked memory according to claim 1, wherein the redundant storage comprises first redundant storage in the first integrated circuit memory chip, and second redundant storage in the second integrated circuit memory chip.

4. The stacked memory according to claim 3, wherein the second redundant storage stores data originally addressed to the first integrated circuit memory chip.

5. The stacked memory according to claim 1, wherein the redundant storage includes multiple banks, each bank including a first sub-storage area for storing the failure address information, and a second sub-storage area for storing the data corresponding to the failure address information.

6. The stacked memory according to claim 1, wherein the first storage area is configured as a direct cache.

7. The stacked memory according to claim 1, wherein the first and second integrated circuit memory chips are interconnected by through-silicon vias.

8. A method of operation in a stacked memory, the method comprising:
    receiving incoming address information for a data transfer operation;
    accessing failure address information stored in a first storage area of redundant storage, the first storage area dedicated to storing failure addresses;
    comparing the incoming address information to the failure address information;
    accessing substitute storage locations corresponding to a matching failure address from a second storage area of the redundant storage, the second storage area dedicated to storing data corresponding to the failure addresses; and
    carrying out the data transfer operation using the substitute storage locations.

9. The method according to claim 8, wherein the accessing failure address information comprises accessing failure address information stored in a first storage area of a redundant memory chip that is stacked with first and second primary memory chips.

10. The method according to claim 8, wherein the accessing failure address information comprises accessing failure address information stored in first redundant storage formed in a first integrated circuit memory chip, and second redundant storage formed in a second integrated circuit memory chip stacked with the first integrated circuit memory chip.

11. The method according to claim 10, wherein accessing a substitute storage location includes accessing a substitute storage location in the second redundant storage for a data transfer involving the first integrated circuit memory device.

12. The method according to claim 9, wherein accessing the failure address information includes accessing a first bank of the redundant storage, the first bank including a sub-storage area dedicated to storing failure address information.

13. The method according to claim 8, wherein:
    the comparing includes matching a tag address representing a failure address to an incoming data transfer address.

14. The method according to claim 8, further comprising:
    during an initialization mode,
    loading the redundant storage with known failure addresses from non-volatile storage.

15. The method according to claim 8, further comprising:
    accessing the redundant storage by through-silicon vias.

16. A memory module comprising:
    a substrate having a databus for coupling to a memory controller;
    a plurality of stacked memories disposed on the substrate, each of the stacked memories including
        a first integrated circuit memory chip having first storage locations,
        a second integrated circuit memory chip disposed in a stacked relationship with the first integrated circuit memory chip, the second integrated circuit memory chip having second storage locations,
        redundant storage including a first storage area dedicated to storing failure address information of failure address locations in the first or second integrated circuit memory chips, the redundant storage including a second storage area dedicated to storing data corresponding to the failure address locations, and
        matching logic to match incoming data transfer addresses to the stored failure address information.

17. The memory module according to claim 16, wherein the redundant storage comprises a dynamic random access memory (DRAM) chip stacked with the first and second integrated circuit memory chips.

18. The memory module according to claim 16, wherein the redundant storage comprises first redundant storage in the first integrated circuit memory chip, and second redundant storage in the second integrated circuit memory chip.

19. The memory module according to claim 16, wherein the second redundant storage stores data originally addressed to the first integrated circuit memory chip.

20. The memory module according to claim 16, wherein the redundant storage includes multiple banks, each bank including a first sub-storage area for storing the failure address information, and a second sub-storage area for storing the data corresponding to the failure address information.

* * * * *